United States Patent
Barth, Jr. et al.

(10) Patent No.: US 6,507,511 B1
(45) Date of Patent: Jan. 14, 2003

(54) SECURE AND DENSE SRAM CELLS IN EDRAM TECHNOLOGY

(75) Inventors: John E. Barth, Jr., Williston, VT (US); Subramanian S. Iyer, Mt. Kisco, NY (US); Babar A. Khan, Ossining, NY (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/969,360

(22) Filed: Oct. 2, 2001

(51) Int. Cl.⁷ ............................................... G11C 11/24
(52) U.S. Cl. ....................... 365/154; 365/149
(58) Field of Search .................. 365/149, 154, 365/150; 257/301, 302, 303

(56) References Cited

U.S. PATENT DOCUMENTS

| | | | | |
|---|---|---|---|---|
| 5,198,995 A | * | 3/1993 | Dennard et al. ............. | 365/149 |
| 5,327,376 A | * | 7/1994 | Semi ........................... | 365/154 |
| 5,495,437 A | * | 2/1996 | Tai et al. ..................... | 365/145 |
| 5,677,866 A | * | 10/1997 | Kinoshita ................... | 365/154 |
| 5,712,813 A | * | 1/1998 | Zhang ......................... | 365/149 |
| 5,844,836 A | * | 12/1998 | Kepler et al. ............... | 365/154 |
| 6,034,877 A | * | 3/2000 | Bronner et al. ............. | 365/149 |
| 6,088,259 A | * | 7/2000 | Chi ............................. | 365/154 |
| 6,285,575 B1 | * | 9/2001 | Miwa ......................... | 365/145 |

* cited by examiner

*Primary Examiner*—Tan T. Nguyen
(74) *Attorney, Agent, or Firm*—Ira D. Blecker; McGuire Woods, LLP

(57) ABSTRACT

Addition of capacitance to the storage nodes of static random access memory cells and other types of integrated circuits substantially increases $Q_{crit}$ and substantially eliminates soft errors due to alpha particles; susceptibility to which would otherwise increase as integrated circuits are scaled to smaller sizes and manufactured at increased integration densities. Formation of the added capacitance as deep trench capacitors avoids any constraint on circuit or memory cell layout. Degradation of performance is avoided and performance potentially improved by permitting alteration of proportions of pull-down and pass gate transistors in view of the increased stability imparted by the added capacitors. One of the capacitor electrodes is preferably shorted to the supply voltage through an impurity well. Thus, the memory cell size can be reduced while greatly reducing susceptibility to soft errors; contrary to the effects of scaling at current and foreseeable feature size regimes.

17 Claims, 6 Drawing Sheets

SECURE AND DENSE SRAM CELLS IN EDRAM TECHNOLOGY

BACKGROUND OF THE INVENTION

1. Field of the Invention

The present invention generally relates to high capacity static random access memories and other types of integrated circuits formed at high integration density and, more particularly, to achieving high levels of immunity to soft errors in such memories.

2. Description of the Prior Art

Since the development of integrated circuits, the potential for reduced signal propagation time and increased functionality of individual chips as well as manufacturing economy has driven development of increases in integration density and scaling of individual circuit elements therein to smaller sizes. This incentive for scaling is particularly strong for memory devices which have approximately quadrupled in capacity every three years. However, such scaling of individual elements inevitably increases criticality of many aspects of operation such as operation at reduced voltages, susceptibility to noise, heat dissipation and the like.

Among other problems aggravated by scaling, particularly in memory structures, is the problem of soft errors due to the transit of alpha particles through a memory cell. Alpha particles are substantially unavoidable in the environment and their relatively high energy causes ionization which can introduce charge into the circuit in an unpredictable manner but without causing damage to the circuit element or impairing its function. In practical effect in a memory cell, the disturbance of charge may be sufficiently great that the storage or logic state of the cell will be changed and the data corrupted but the cell will be capable of functioning correctly when new data is stored. For this reason, such errors are referred to as "soft" as opposed to "hard errors" such as a failed transistor or a wiring defect which prevents correct functioning of the circuit.

Scaling causes increased susceptibility to soft errors because it decreases the amount of charge required to induce a soft error through a number of mechanisms. That is, the amount of charge developed by the traverse of a given alpha particle through a circuit is highly variable depending on a number of factors such as the energy of the alpha particle, its trajectory through the circuit and the like. Therefore, not all incident alpha particles will induce a soft error. However, reduction of the amount of charge necessary to induce a soft error (or, for that matter, an intended change of logic state) can be considered as a reduction in the stability of a memory cell and, for a given distribution of energies and trajectories of a given flux of alpha particles, the number of soft errors will increase as the critical amount of charge that will induce a soft error, $Q_{crit}$, decreases. The amount of charge that can upset a memory cell of a given type has been decreasing by about one-half per generation; more or less proportionally to the decrease in circuit element and memory cell dimensions.

Further, numbers of soft errors per chip are increased by increased integration density. Substantially increased total soft error rates of about 50K ppm/khr/chip (with some significant differences between low to high and high to low transition errors) are projected for 8 Megabyte memories currently being designed and manufactured having a cell size of about 2.5 to 5 $\mu m^2$. That is, while soft errors are relatively rare and current memory cell designs are highly reliable and stable, such a memory can now be expected to experience a soft error, on average, every one to two months and may vary significantly (e.g. may double or more) with the logic state stored. (By way of comparison, soft error rates were negligible in SRAM designs of only a few generations previous to current designs.) Given the amount of memory generally associated with modern processors and the fact that any soft error corrupts data or an application program, it can be readily appreciated that some provision must be made for correction or avoidance of soft errors in order to support acceptable processor performance.

Unfortunately, most approaches to soft error correction compromise performance, especially processing speed, and/or integration density. That is, error detection/correction circuits or redundant designs that have been used in the past to alleviate the problem of soft errors are either very expensive and/or very slow. For example, some designs duplicate the cell array and, upon read out, picks the data with correct parity rather than performing a slow and complicated error detection and correction procedure even though such an approach more than doubles cost, limits usable memory capacity per chip and increases access time.

It has also been proposed to harden memories against soft errors by using triple well designs and/or to use B11-enriched BPSG processes. However, this approach does not provide protection against soft errors and, in fact, would provide only a marginal (10–50%) reduction in soft error rates while increasing production costs significantly. The addition of further circuit elements such as resistor-capacitor circuits to increase stability of memory cells by reducing alpha particle induced transients have been proposed but would result in much larger cell size and much slower access time as well as increasing power consumption and heat dissipation requirements. Neither of these proposals would avoid a need for error detection and correction circuitry which is slow and complicated; reducing overall processor performance.

SUMMARY OF THE INVENTION

It is therefore an object of the present invention to provide a memory cell design having reduced susceptibility to soft errors without compromise of either cell size or access time and without significantly increasing manufacturing cost or reducing manufacturing yield.

It is another object of the present invention to provide a technique of greatly reducing susceptibility to soft errors that can be implemented in arbitrary and/or existing memory cell designs.

In order to accomplish these and other objects of the invention, a circuit integrated on a chip is provided including an active digital circuit having a storage node, a deep trench capacitor formed under and having an electrode connected to a connection of the storage node.

In accordance with another aspect of the invention, an integrated circuit is provided including a circuit having a storage node, an impurity well region and a deep trench capacitor connected to said storage node, said deep trench capacitor including a connection to a plate of the deep trench capacitor being formed by the impurity well region.

In accordance with a further aspect of the invention, a method for making an integrated circuit is provided comprising steps of forming a deep trench capacitor and a circuit having a storage node overlying and connected to the capacitor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figures 1, 1A:
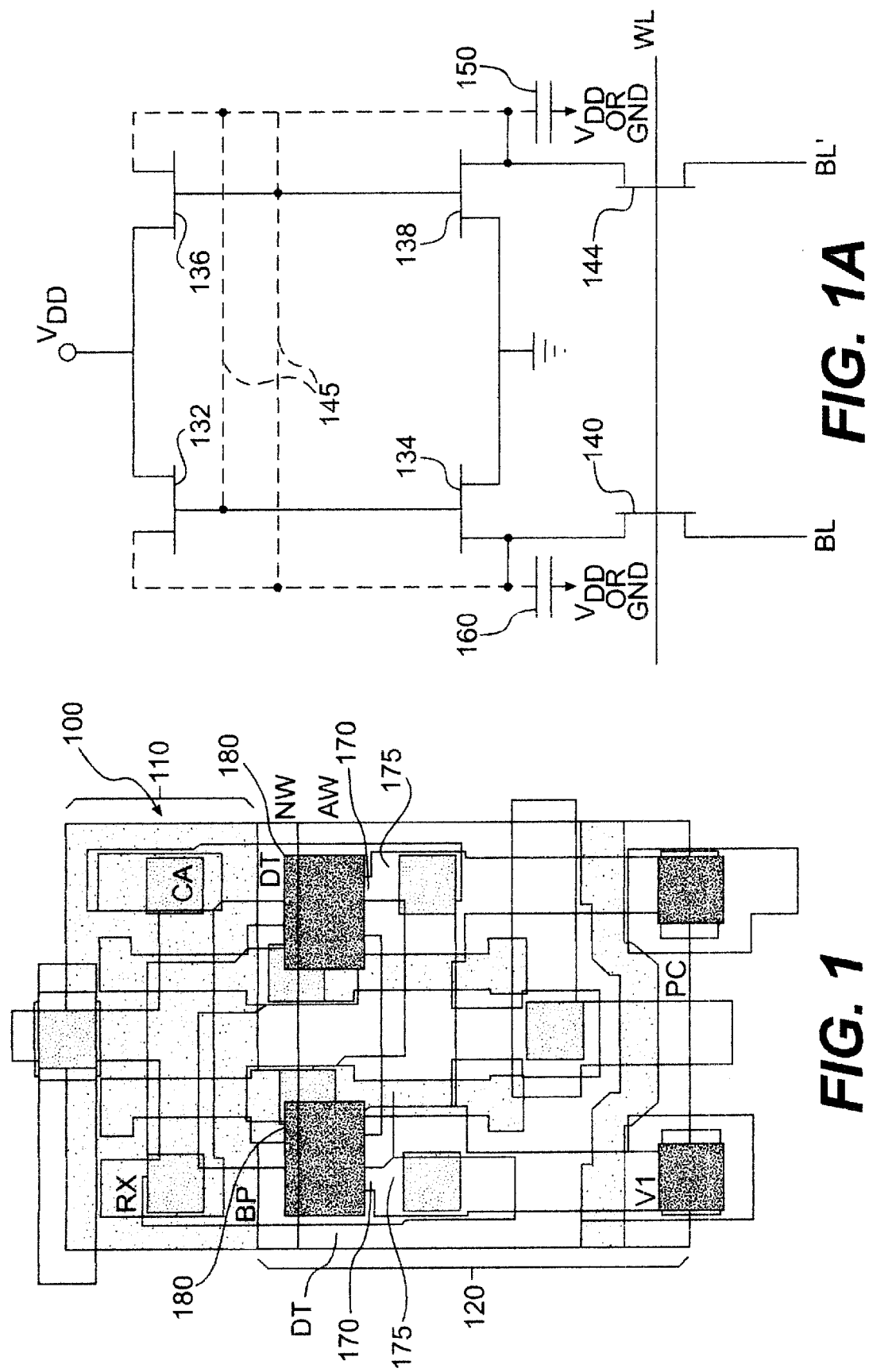
FIG. 1 is a plan view of an exemplary memory cell layout including the invention.
FIG. 1A is a schematic diagram of the memory cell circuit of FIG. 1 arranged in accordance with the plan view of FIG. 1.

Referring now to the drawings, and more particularly to FIG. 1, there is shown, in plan view, the layout of an exemplary memory cell including the invention. It is to be understood that the invention can be implemented with arbitrary memory cell circuits or other active integrated circuits (e.g. registers, logic arrays, processors and the like) as will be demonstrated by discussion of FIGS. 1, 3 and 4, respectively, while FIG. 2 and the discussion thereof will demonstrate that the invention does not complicate or otherwise require any modification of the overall layout of the memory cell array on a chip.

Thus, those skilled in the art will be enabled to incorporate the invention, in accordance with its basic principles, to reduce soft error susceptibility in any memory cell and array design as well as other integrated circuits such as processors, logic arrays and the like. By the same token, it is to be understood that while similar memory cell layouts may be known and details thereof are not important to the practice of the invention, some advantageous modifications of the layout enabled by the invention are depicted in FIGS. 1–5 and no portion of any of these Figures is admitted to be prior art as to the present invention.

It should also be appreciated that many different types of data storage structures are known in the art; each with its own potentialities and problems. For example, so-called static random access memories (SRAMs) offer the fastest access time because they need not be refreshed or use sense amplifiers capable of sensing a minute difference in charge which may slow response time in dynamic memories where data is passively stored as charge on a small capacitor since the static memory cells are inherently more capable of driving the capacitive load presented by the bit lines. Thus static memories are often used for caching at a location hierarchically adjacent a processor, often on the same chip with the processor or other logic devices such as in registers.

However, static memory cells present problems which have been largely intractable in regard to soft errors, particularly as attempts are made to increase chip capacity. Specifically, static memory cells require more active devices (e.g. transistors) per memory cell and therefore scaling must be more aggressive to increase memory capacity and integration density. At the same time, scaling decreases the current carrying capacity of individual transistors and can reduce stability of the cell and well as the ability of the cell to drive the capacitance of connected bit lines. Scaling also reduces the capacitance of the storage nodes of the cell and increases the voltage disturbance imposed by a given amount of ionization engendered by an alpha particle while the increase in resistance of transistors reduces the ability of the memory cell to dissipate such a disturbance.

Additionally, since static memories are hierarchically proximate to the high speed circuitry which utilizes the data stored, the opportunity for providing error detection and correction is reduced and error checking and correction often compromises response and memory access speed, particularly if correction must be performed. Therefore, the problem of soft errors is particularly critical in SRAM structures and it is anticipated that the invention will have most beneficial applicability in that environment. Accordingly, while the invention will be disclosed in connection with an SRAM environment which is currently preferred by the inventors, it should be understood that the invention is applicable to other integrated circuit environments, as well.

The invention, in accordance with its basic principles, approaches the soft error problem directly by adding capacitance to increase the amount of charge required to disturb the cell and to absorb transient voltages due to ionization caused by alpha particles without requiring additional chip surface space. As perfecting features of the invention, increase of cell size is avoided by placement of deep trench capacitors below desired connection nodes while memory cell space can be reallocated to substantially avoid deleterious effects of the added capacitance on cell performance and access time. Many suitable designs for deep trench capacitors are known and well-understood in the art for dynamic RAMs and the inclusion of deep trench capacitors in the memory chip does not add significantly to the chip cost or compromise manufacturing yield for that reason. The use of deep trench capacitors such as are used in dynamic RAMs in a static RAM (SRAM) or other active integrated circuit structure is thus referred to as "embedded dynamic RAM (EDRAM) technology" since it involves embedding a capacitor such as would normally be used in a passive DRAM cell in an active logic circuit.

As further advantages of the invention, the use of embedded capacitors allows a cell size reduction of about 5%–10%. The pull-down NFETs of the circuit can be reduced to minimum size (e.g. 0.11 μm rather than 0.18 μm to 0.24 μm) since the beta ratio (the ratio of conductance of the pull-down NFET to the conductance of the pass gate NFET) for cell stability is no longer a consideration. This allows space that can be exploited to increase width of the pass gate transistors to reduce the pass gate resistance and thus reduce writing time that would be expected to be increased by the addition of the capacitors, as alluded to above. Read time is decreased somewhat, as well, since the stored logic voltage will be stabilized and drive capability will be increased by the additional charge stored in the capacitors.

Figure 3A:
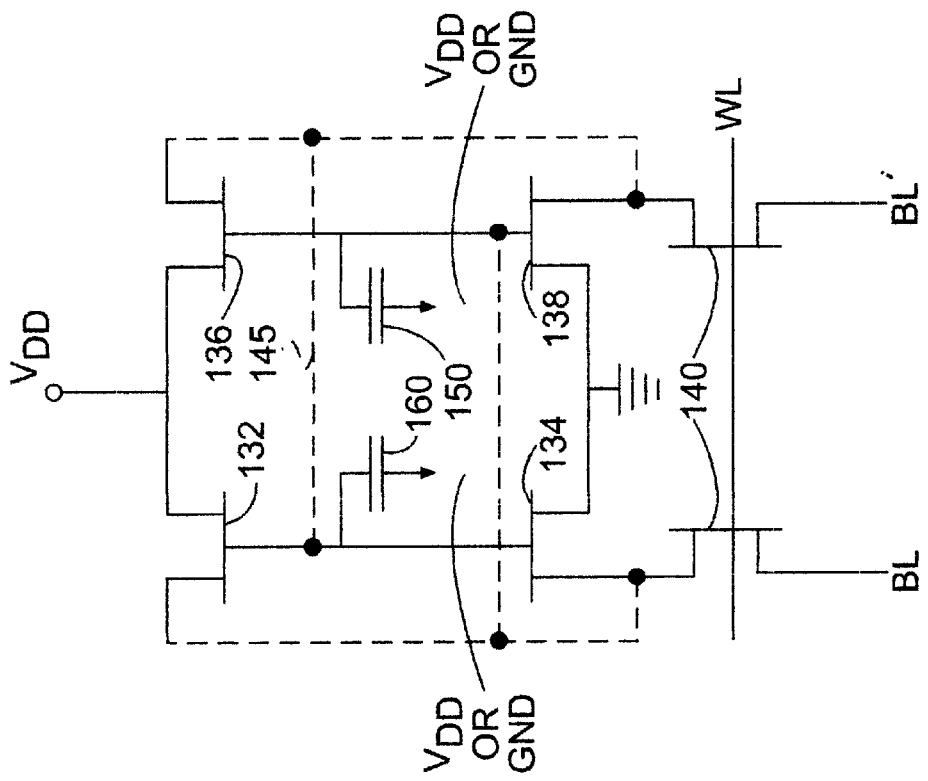
FIG. 3A is a schematic diagram of the memory cell circuit of FIG. 3 arranged in accordance with the plan view of FIG. 3.
Figure 3:
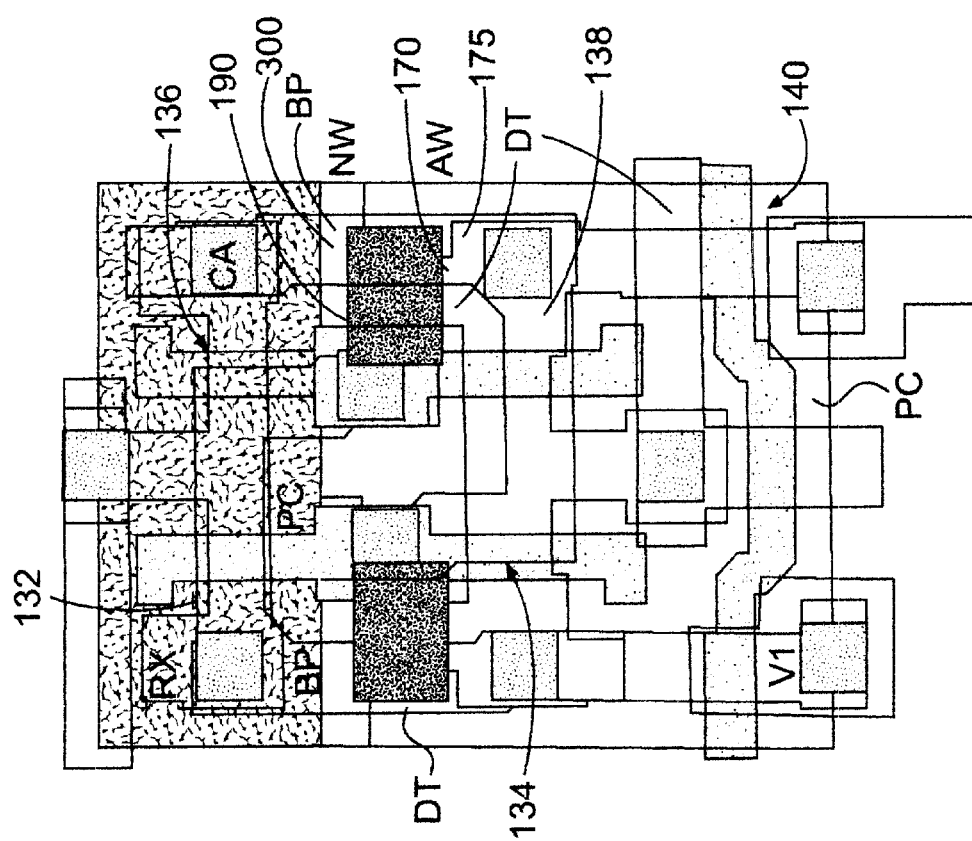
FIG. 3 is a plan view of an alternative layout of a memory cell including the invention.

Specifically, and with reference to FIGS. 1 and 3, it will be recognized by those skilled in the art that the static memory cell 100, 300 depicted in plan view includes six transistors and has a pair of complementary bit lines (sometimes referred to as dual-rail) and a single word line, as shown in FIGS. 1A and 3A, respectively. Some internal connections are omitted from FIGS. 1 and 3 in the interest of clarity and since the configuration thereof is not critical to the practice of the invention. These internal connections are included as dashed lines in FIGS. 1A and 3A which are otherwise arranged in the same configuration as FIGS. 1 and 3, respectively, but are also schematic and thus not intended to depict or infer the location or configuration of internal connections. It will also be evident that The schematic diagrams of FIGS. 1A and 3A are the same except for the location of elements intended to identify corresponding structures in FIG. 1 and FIG. 3, respectively.

Figure 2:
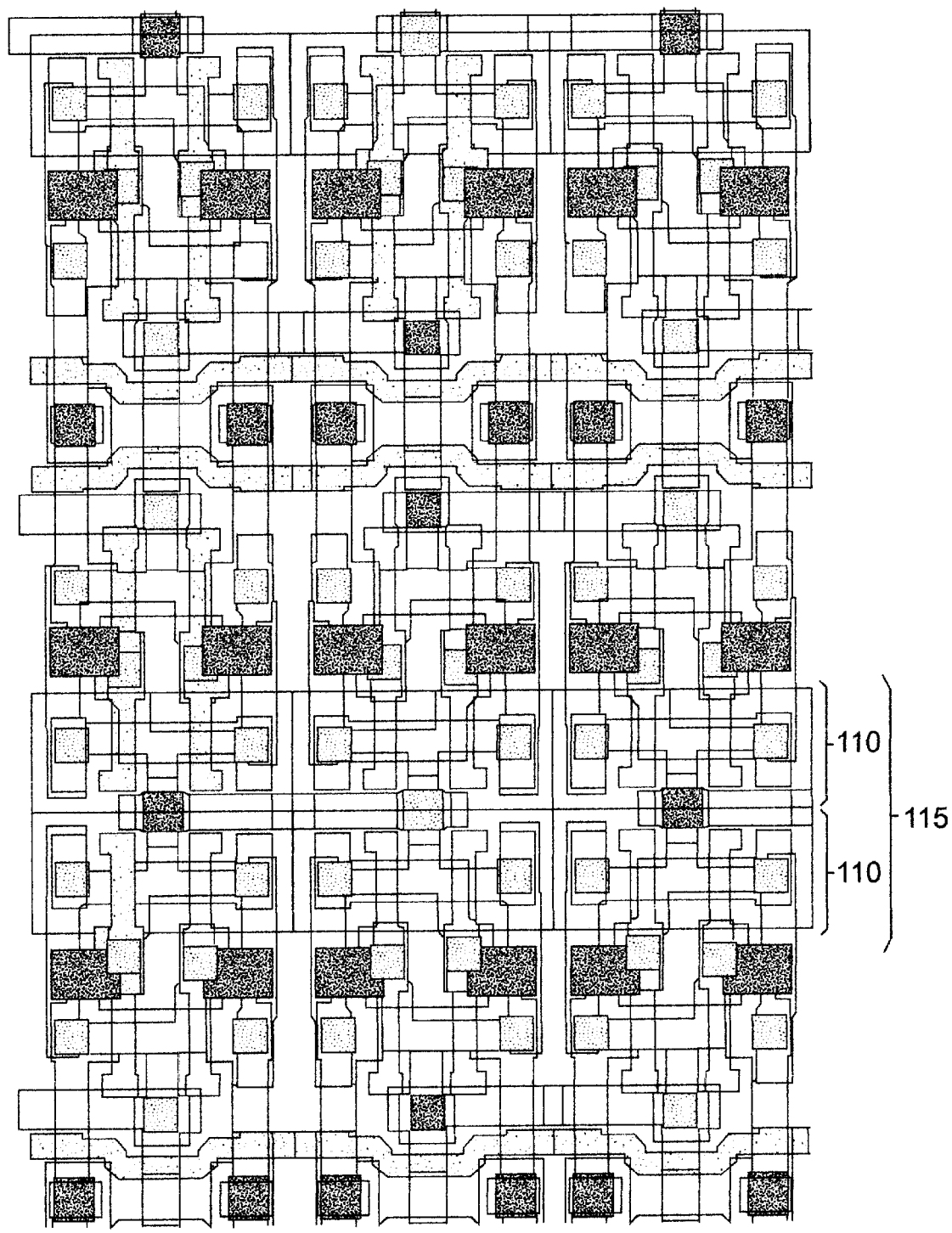
FIG. 2 is a plan view of a portion of a memory chip including a plurality of the memory cells of FIG. 1.

In FIGS. 1 and 3, the area occupied by the memory cell 100 is divided into an N-well region 110 and another region 120 which is generally P-doped wafer but could also be implemented as a P-well. The impurity types could also be reversed. These regions are preferably implemented on the wafer in doubled stripes as shown in FIG. 2 for convenience in fabricating and wiring the array of memory cells.

Transistors 132 and 134 are arranged as an inverter circuit, as are transistors 136 and 138. Transistors 132 and 136 are formed in the N-well region and ar pull-up PFETs. Similarly, transistors 134 and 138 are formed in the P-well region of the wafer and are thus pull-down NFETs serially connected to the pull-up PFETs and with a common gate connection so that when the PFET is turned on, the NFET will be turned off and vice versa. The common gate connections are also cross-connected to the output node of the other inverter, as illustrated at dashed lines 145, to form a bistable memory cell circuit.

Both of the inverter circuits are serially connected to respective pass gate transistors 140 with a common gate connection corresponding to the word line, WL. These transistors, so connected, provide for selection of the memory cell for reading or writing over complementary bit lines BL and BL'. If the voltage on bit line BL exceed that on BL' or vice-versa, and coupled to the bistable circuit through pass gate transistors 140 the cross-coupled inverters described above will be driven to opposite conductive states quickly through feedback in the cross-coupling connection 145 and will retain that state indefinitely unless disturbed by an opposite voltage occurring on the cross-coupling nodes as would normally be applied through the bit lines and pass gate transistors 140.

However, as the memory cell as well as the transistors is reduced in size, the capacitance of the cross-coupling nodes becomes smaller and less charge is required to impose a voltage on the nodes 145 which may be relatively close to the mid-point of the voltage swing between $V_{DD}$ and ground. The operating voltage, $V_{DD}$, of the memory cell may also be decreased in some designs. It is by reason of these collective effects of scaling of the transistors and memory cell to smaller sizes that $Q_{crit}$ is very significantly reduced to values which can be supplied by greater fractions of incident alpha particles; resulting in an increased susceptibility to soft errors.

The invention directly increases $Q_{crit}$ without increasing required chip space by adding a deep trench capacitance to nodes 145 by the connection of deep trench capacitors 150/160 to one or both of those nodes. The added capacitance is about 35 femtofarads which is significantly larger than the capacitance of the storage nodes 145 which is about 1–2 femtofarads. The increase $Q_{crit}$ and by a factor of ten to twenty effectively eliminates susceptibility to soft errors for current and foreseeable integration density and feature size regimes. For example, it has been shown by simulation that the memory cell of FIG. 1 can be scaled/reduced to a size of 1.21 to 1.31 $\mu m^2$ or less while the soft error immunity is better than older and larger cells of 10 $\mu m^2$ of three memory cell generations earlier.

The differences in layout between FIGS. 1 and 3 are intended to show the non-criticality of placement of the capacitors 150, 160 by slight modification of the connections. In fact, the deep trench configuration of the preferred for of the capacitors can be (electrically) placed at any convenient location along the connections forming the storage nodes of the cell. Placement of the deep trench capacitor at the border of the N-well region is, however, important to maintaining small cell size and integration density as will be discussed in greater detail below in connection with FIG. 5 but some portion of the storage node connections will always cross this region and form a convenient location for the deep trench capacitor connection.

In FIG. 1, for example, the connection of the capacitor 150, 160 to the storage node 145 can be made at either an extension 170 of connection 175 or directly to the common gate connection 180 and can even form a portion of the internal memory cell connections. The same is true for the layout of FIG. 3 but where an additional connection to the source/drain of transistors 132 or 136, respectively, is available. It is also possible to practice the invention with only one capacitor connected to only one side of the storage nodes. Such a variant form of the practice of the invention will, in fact, stabilize the cell substantially against soft errors with the charge required to cause a soft error increased to about one-half that available from connecting capacitors to both sides of the storage node. However, it should be appreciated that even this increase in $Q_{crit}$ represents a dramatic improvement over soft error rates that would otherwise occur; substantially eliminating soft errors due to alpha particles.

Referring now to FIG. 2, a plurality of memory cells corresponding to the layout of FIG. 1 is shown Alternating rows of cells are inverted and the N-well and P-well/triple well stripes are doubled as alluded to above. It should be noted that the P-well/triple well structure illustrated may be required in order to bias the deep trench capacitor in the region of the NFET devices. Triple well devices are also believed to be less susceptible to soft errors caused by alpha particles. However, the triple well structure presents process complexity and is not necessary for purposes of capacitor bias if the capacitor can be located adjacent the N-well, which also allows reduction of cell size as noted above. This preferred form of the invention will be discussed in greater detail below in connection with FIG. 5.

As in FIG. 1, lightly hatched square shapes represent contacts for internal connections and darkly hatched square represent contacts to wiring at locations above the plane of the page with contacts to $V_{DD}$ and ground running in the column direction (M2) being alternated in the row direction, as depicted, and each contact being made to a pair of cells with horizontal connections at a further wiring level (M1) to an adjacent pair of cells.

Darkly hatched rectangles depict capacitors 150, 160 as in FIGS. 1 and 3 and, in the preferred deep trench configuration do not require modification of transistor or connection layout (although allowing some advantageous modifications to be made, such as decreasing size of the NFET pull-down transistors 134, 138 and increase of width of the pass gate transistors 140 as alluded to above). Therefore, implementation of the invention does not place any constraint on the memory cell array and the invention is fully applicable to process-of-record (POR) designs.

Figure 4:
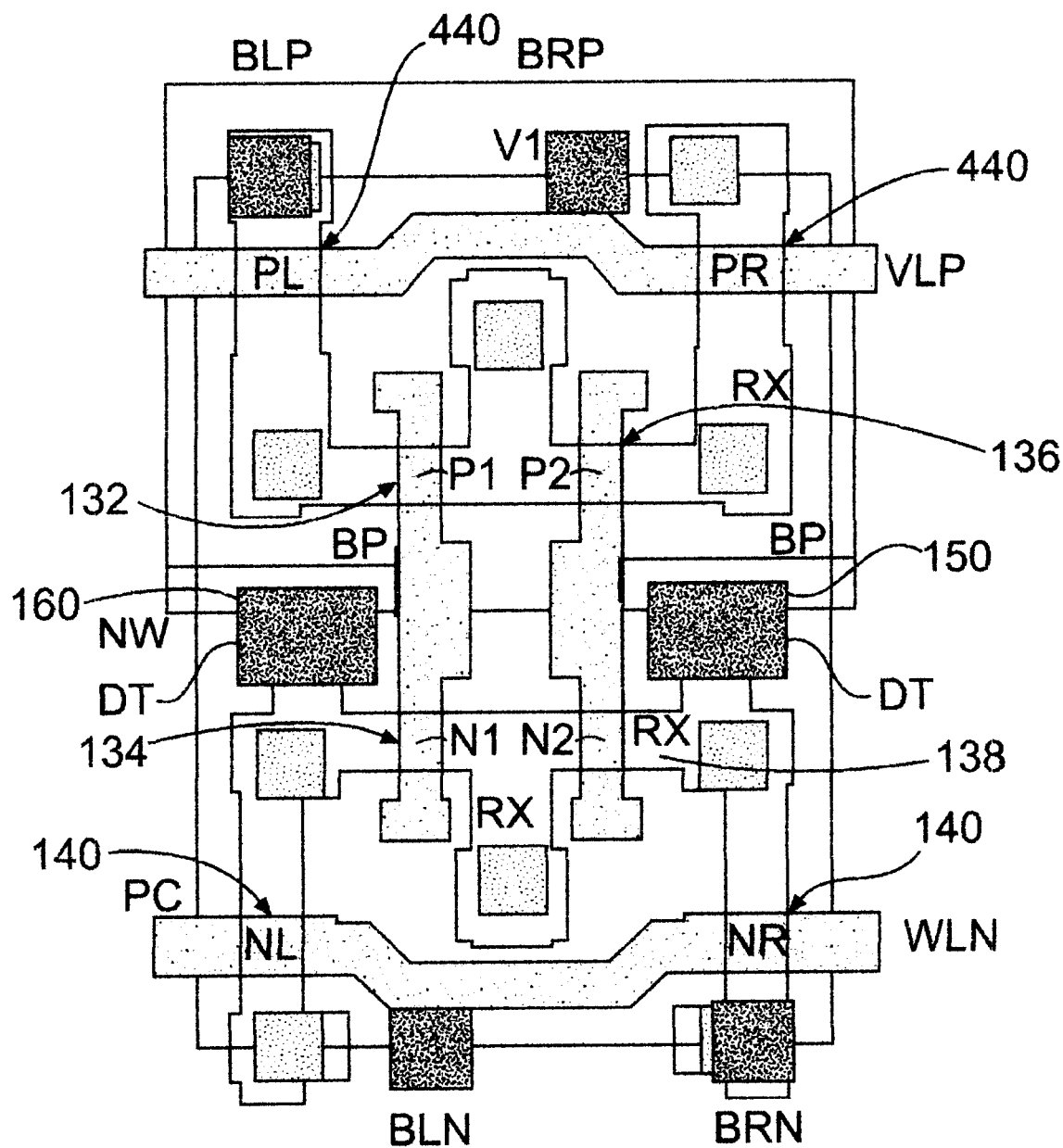
FIG. 4 is a plan view of a alternative, dual port memory cell including the invention.

For example, referring to FIG. 4, application of the invention to a different design of static memory cell will now be discussed. In this memory cell design, eight transistors are provided to accommodate dual-rail complementary word lines. That is, transistors 132–140 (transistors 140 being controlled by word line WLN) are provided as in FIGS. 1 and 3 but additional PFET pass gate transistors 440 are provided in series with PFET pull-up transistors 132 and 136 in the N-well and controlled by a second word line WLP. Capacitors 150, 160 are placed below electrically arbitrary portions of the storage nodes, as before, but preferably adjacent the N-well for the reasons discussed above. Both pairs of pass gate transistors can be increased in width since the NFET pull down transistor size may be minimized. Thus it is seen that the invention is fully applicable to static memory cells of arbitrary design and does not require significant compromise of performance, if any, or impose constraints on layout design.

Figure 5:
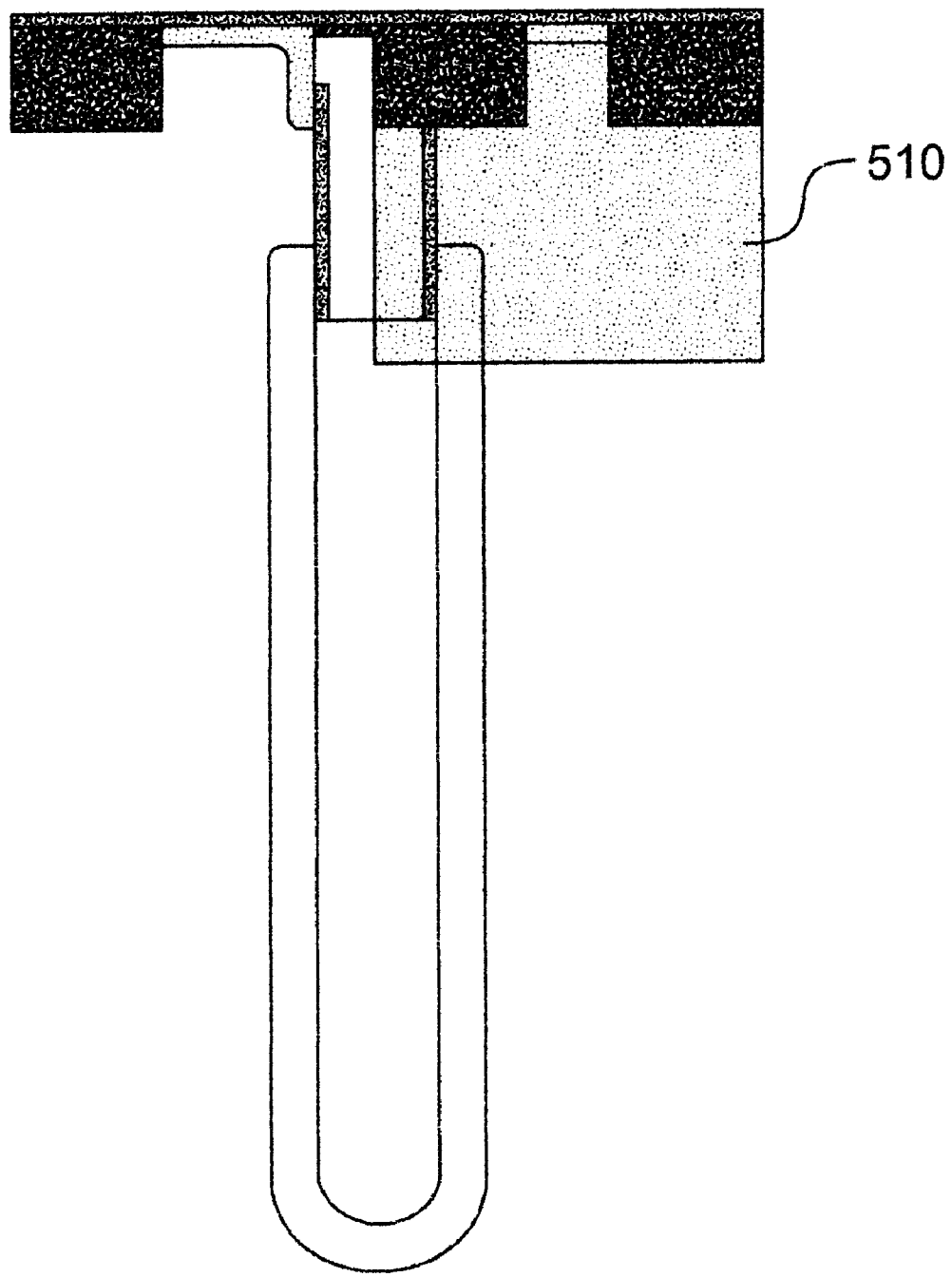
FIG. 5 is a cross-sectional view of an exemplary capacitor preferred for implementation of the invention showing exemplary formation of connections thereto.

Referring now to FIG. 5, an exemplary and preferred form of deep trench capacitor suitable for practice of the invention will be discussed. This design and techniques for fabrication thereof are well-understood by those skilled in the art. The principal difference between the capacitor illustrated in FIG. 5 and those known in the art is that an implanted N-type buried N-well (sometimes referred to as a triple well) and N+type implanted connection thereto is generally necessary for forming and making a common ground connection to one (the outer) of the capacitor plates, as can be used in the practice of the invention. However, several advantages can be achieved by replacing the buried N-well and implanted connection with the N-well implant 510 (110) if the capaci-
tor can be placed adjacent thereto, as is generally the case, as discussed above. When this can be done, the N-well connects the capacitor plate to $V_{DD}$ rather than to ground. This expedient also allows the triple well structure to be omitted and the memory cell and capacitor to be formed directly on the wafer once the N-well is implanted, shorted to $V_{DD}$.

Figure 6:
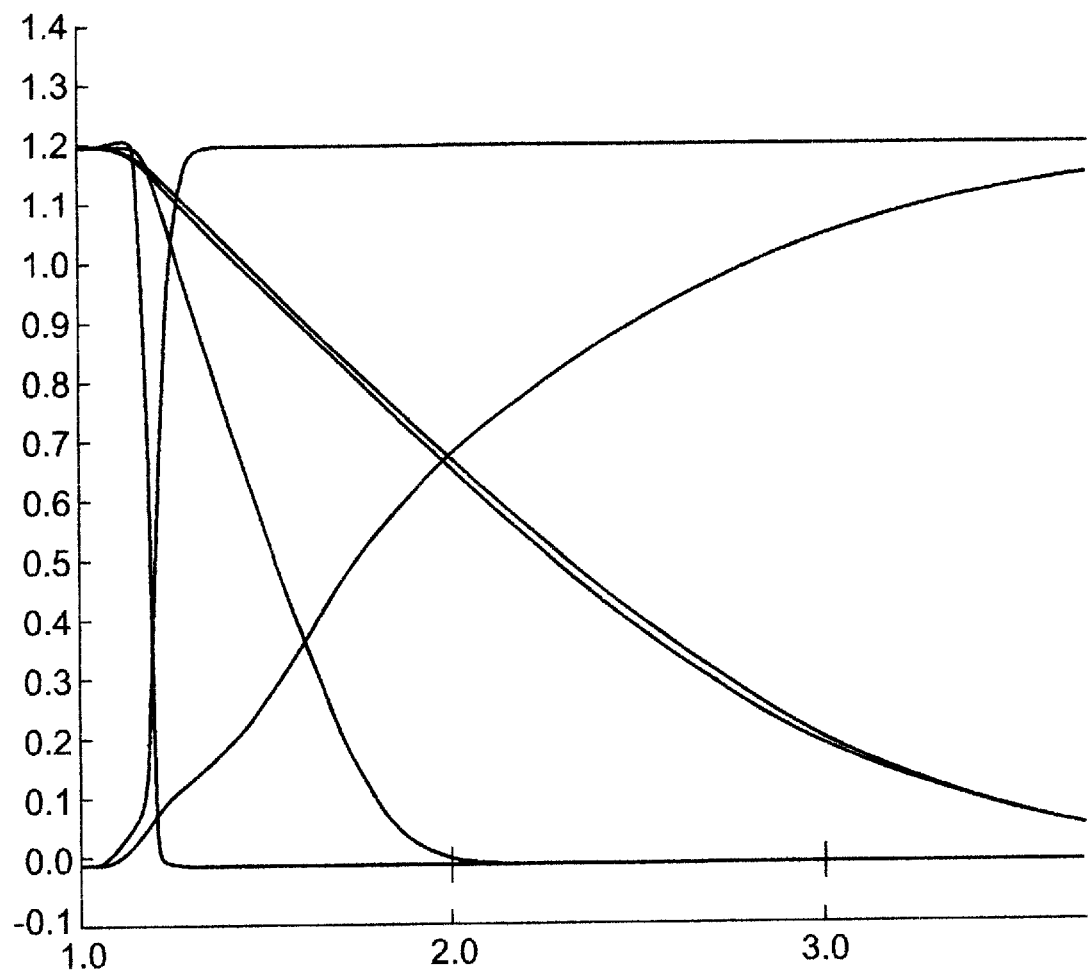
FIG. 6 is a graphical depiction of the effects of the invention in a memory cell.

Referring now to FIG. 6, simulations of switching characteristics of the circuit of FIG. 1 are shown both with and without the capacitors connected to the storage nodes in accordance with the invention. In a memory cell in accordance with either FIG. 1 or FIG. 3 without the capacitances in accordance with the invention, the memory cell begins to switch (a write operation where the bit line voltages can be rapidly changed by an external driver) when the voltages on the two storage nodes are equal at about 0.3 volts, 0.2 nanoseconds after application of voltages to the storage node and the switching is substantially completed in about 0.4 nanoseconds.

With the capacitors in accordance with the invention, this point is reached (at an increased voltage) after about 0.6 nanoseconds with switching being substantially complete in about 3.0 nanoseconds. While this switching time is increased due to the added capacitive load, it remains comparable to the bit line signal propagation time/slew rate during a read operation where the bit line voltages are balanced and then pulled to ground or $V_{DD}$ by the memory cell) since the bit line also presents significant capacitance. Therefore, the increase in writing time due to the capacitors in accordance with the invention does not compromise memory operation cycle time which is limited by the bit line slew rate as driven by the memory cell. The improvement in drive capability derived from increasing conductance of the pass gate transistors and the charge stored in the capacitors in accordance with the invention provides a slight improvement in read response speed while virtually eliminating soft errors due to alpha particles.

In view of the foregoing, it is seen that the addition of capacitance to the storage nodes of an arbitrary static memory cell can substantially eliminate soft errors regardless of scaling to small sizes and with little, if any, compromise of access time for reading or writing operations. The increased cell stability due to the added capacitance allows alteration of proportions of the pull down transistors and the pass gate transistors to compensate for the additional capacitive loading. The invention can be applied to any static memory cell or other integrated circuit device of arbitrary design to reduce soft errors to vanishingly small error rates and thus supports high processor performance additional structural, electrical and manufacturing advantages can be derived if the deep trench capacitor can be located adjacent the N-well, as is generally the case.

While the invention has been described in terms of a single preferred embodiment, those skilled in the art will recognize that the invention can be practiced with modification within the spirit and scope of the appended claims.

Having thus described my invention, what I claim as new and desire to secure by letters patent is as follows:

1. A circuit integrated on a chip including
    an active digital circuit having a storage node,
    a deep trench capacitor formed under and having an electrode connected to a connection of said storage node.

2. A circuit as recited in claim 1, wherein said active circuit is a bistable circuit.

3. A circuit as recited in claim 2, wherein said bistable circuit comprises a pair of cross-coupled inverter circuits.

4. A circuit as recited in claim 2, wherein said bistable circuit comprises a pair of storage nodes.

5. A circuit as recited in claim 4, wherein said deep trench capacitor is connected to one of said pair of storage nodes.

6. A circuit as recited in claim 4, wherein a said deep trench capacitor is connected to each of said pair of storage nodes.

7. A circuit as recited in claim 1, wherein said deep trench capacitor include a plate connected to an impurity well region.

8. A circuit as recited in claim 7, wherein said impurity well region is an N-well.

9. A circuit as recited in claim 8, wherein said deep trench capacitor is located adjacent said N-well.

10. A circuit as recited in claim 1, wherein said circuit include pull up transistors in an impurity well and said deep trench capacitor is located adjacent said impurity well.

11. A circuit as recited in claim 1, wherein said circuit is a memory cell of a static random access memory.

12. An integrated circuit including a circuit having a storage node, an impurity well region and a deep trench capacitor connected to said storage node, said deep trench capacitor including a connection to a plate of said deep trench capacitor being formed by said impurity well region.

13. An integrated circuit as recited in claim 12, wherein said impurity well region is an N-well.

14. An integrated circuit as recited in claim 12, wherein said integrated circuit is a static random access memory.

15. An integrated circuit as recited in claim 12, wherein said circuit having a storage node is a static memory cell and wherein said capacitor has a value at least equal to a capacitance of said storage node, whereby said static memory cell may be formed at a reduced size while having increased resistance to soft errors induced by alpha particles.

16. A method of making an integrated circuit, said method comprising steps of forming a deep trench capacitor in a body of semiconductor material, and forming a circuit having a storage node at a surface of said body of semiconductor material, a portion of said storage node overlying and being connected to an electrode of said capacitor.

17. A method as recited in claim 16, including the further step of forming an impurity well, said impurity well and said capacitor being adjacent to each other whereby said impurity well forms a connection to another electrode of said capacitor.

* * * * *